United States Patent [19]

Ternes

[11] Patent Number: 5,042,165
[45] Date of Patent: Aug. 27, 1991

[54] STEP AND REPEAT APPARATUS

[75] Inventor: Gretchen Ternes, Shoreview, Minn.

[73] Assignee: Ternes-Burton Company, Roseville, Minn.

[21] Appl. No.: 543,412

[22] Filed: Jun. 26, 1990

Related U.S. Application Data

[63] Continuation-in-part of Ser. No. 276,892, Nov. 28, 1988, Pat. No. 4,987,686.

[51] Int. Cl.⁵ .............................................. G01D 21/00
[52] U.S. Cl. ..................................................... 33/623
[58] Field of Search ............................ 33/614, 615–623; 355/72–76, 86, 87, 625, 91, 92, 95; 101/382 MV

[56] References Cited

U.S. PATENT DOCUMENTS

| | | | |
|---|---|---|---|
| 2,983,049 | 5/1961 | Andrisani | 33/623 |
| 3,922,087 | 11/1975 | Diccou | 355/87 |
| 4,294,539 | 10/1981 | Spehrley | 355/76 |

FOREIGN PATENT DOCUMENTS

| | | | |
|---|---|---|---|
| 535732 | 1/1957 | Canada | 355/87 |
| 1184203 | 12/1964 | Fed. Rep. of Germany | 355/73 |

Primary Examiner—Harry N. Haroian
Attorney, Agent, or Firm—Moore & Hansen

[57] ABSTRACT

The invention comprises a step and repeat board having an upper surface with oriented peaks and valleys, the valleys intersecting one another to form a texture or finish constituting a level hair-line cell structure wherein the valleys preferably have an average depth on the order of 0.003 to 0.004 inches.

20 Claims, 2 Drawing Sheets

STEP AND REPEAT APPARATUS

This application is a continuation-in-part of co-pending application Ser. No. 276,892 filed on Nov. 28, 1988, now U.S. Pat. No. 4,987,686.

FIELD OF THE INVENTION

The present invention relates to an apparatus used in preparing printing plates, and more particularly to an apparatus for positioning an image carrier in a step and repeat type photocomposing process.

BACKGROUND OF THE INVENTION

For many years, lithographic printing has utilized a process known as step and repeat photocomposing. In such a process, rows and columns of aligned images are prepared by stepping an image producing film transparency from position to position. In the past a difficulty was encountered in precisely locating the image producing film transparency in such a manner as to properly locate the various images. Also, in multi-color printing where several colored images are to be reproduced by stepping type of photocomposing, a problem was encountered in registering the film transparencies or the carriers bearing the film transparencies. The problems were at least partially solved by an invention described and claimed in U.S. Pat. No. 2,983,049. The apparatus there described has been highly successful for many years. Certain problems have persisted over the years even with the use of such apparatus. In the operation of the step and repeat apparatus of U.S. Pat. No. 2,983,049, a vacuum is drawn between the step and repeat board and the film transparency. Since the process is repeated many times during the work day, time is of the essence. Therefore, a need for improvement in cycling time has remained. Another problem has been encountered in the vacuum draw-down of the film transparency in which certain areas of the film transparency may be blocked. In other words, a small amount of air remains between the film transparency and the exposing material mounted on the step and repeat board. The lack of perfect vacuumizing creates some surface irregularity and thus the precise contact or exposure of the images to the material to which the images are being transferred.

In the present invention, an improvement was obtained in the rate at which draw-down may be obtained during vacuumizing, for example, improvement of as much as 20-50% over those encountered in the past. The present invention also serves to minimize or eliminate any loss of precise contact thus providing significant improvement in the precision of transferring of images.

BRIEF SUMMARY OF THE INVENTION

The present invention relates to a step and repeat apparatus which includes a board that has a plurality of openings aligned adjacent at least one edge. The board desirably has such openings aligned adjacent each of the four edges of the board. The board further includes a bed comprising polymeric material, preferably a vinyl material which has an upper surface with a level hair-line cell structure. The hair-line cell structure is comprised of a plurality of peaks and intersecting valleys with the valleys being formed between the peaks. The valleys are oriented so that in average they run generally parallel to one another and toward the direction of the board from where the vacuum is to be drawn. The vinyl layer is adhered to the board to provide a stable mounting. The vinyl sheet desirably is of a composition that provides a high impact strength, good abrasion resistance, stiffness and hardness. Desirably, the surface is resistant to chemical deterioration. It has been found that acrylic/PVC thermoplastic sheet provides the desired characteristics. The step and repeat board further includes auxiliary equipment including indexing spacers with pins for locating the film transparency in a precise location on the board. The board further includes an aluminum underlayment for purposes of stability, particularly on larger products.

DESCRIPTION OF THE PREFERRED EMBODIMENT

Figure 1:
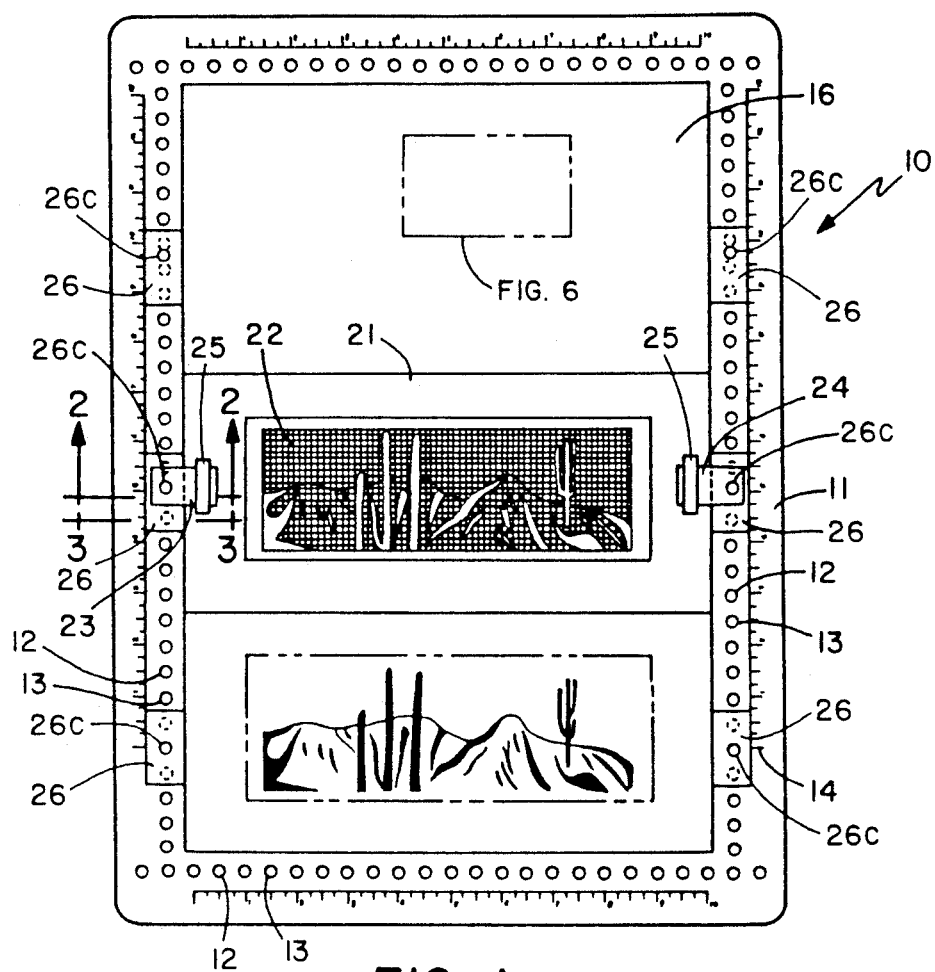
FIG. 1 is a top plan view of the step and repeat apparatus according to the present invention.
Figure 2:
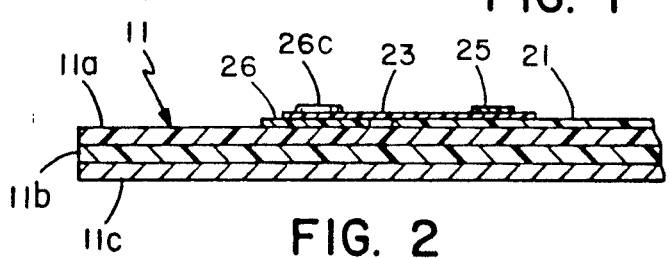
FIG. 2 is a sectional view taken along the lines 2—2 in FIG. 1.
Figure 4:
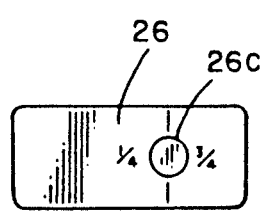
FIG. 4 is a top plan view of a step and repeat registration pin.
Figure 3:
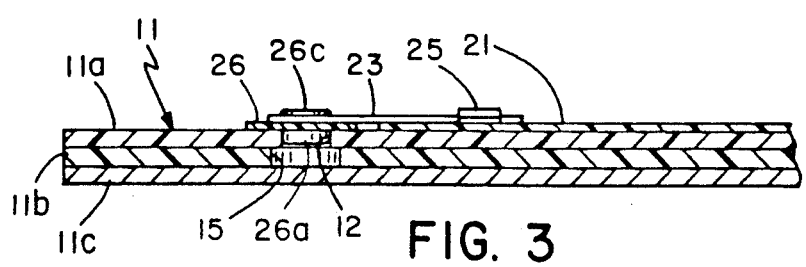
FIG. 3 is a cross-sectional view taken along the lines 3—3 in FIG. 1.
Figure 5:
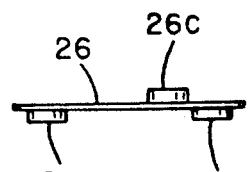
FIG. 5 is a side view of the step and repeat registration pin of FIG. 4.

The step and repeat apparatus 10 of the present invention is illustrated in FIGS. 1-6. The apparatus 10 includes a photocomposition board 11 that may be constructed of any stable material. For example, it may be of semi-rigid polyester film sheet material. The board 11 may include a plurality of indexing holes or openings 12, 13 adjacent one or more edges of the board for purposes hereinafter described. The board may also include a numerical ruler 14 imprinted thereon as illustrated in FIG. 1. The board 10 may be multilayered including an upper pair of polymeric layers 11a, intermediate pair of polymeric layers 11b, and an aluminum layer 11c. As used herein, the photocomposition board 10 may also be of a type having no indexing openings 12, 13 for registration, such as in the case of a contact board or contact sheet, or may be any suitable type of photocomposition board 10 which is placed within a vacuum frame and a vacuum drawn thereon during the photocomposition or printing process.

In the preferred embodiment of the present invention as illustrated in FIG. 1, the plurality of openings 12, 13 are provided substantially around the perimeter. The openings 12, 13 are precisely located with respect to one another in order to facilitate accurate registration during use. Each opening 12, 13 in layer 11a is generally aligned over a corresponding opening 15 of slightly greater diameter.

Figure 6:
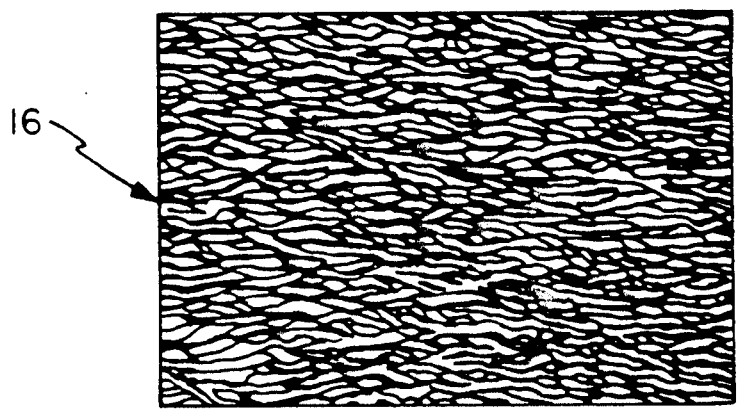
FIG. 6 is a top plan view of the hair-line cell structure of the material forming the bed of the step and repeat apparatus of FIG. 1.

The apparatus 10 further includes a bed 16 which may be a vinyl sheet or layer adhered to the board 11. The sheet material forming the bed 16 desirably is of a rigid acrylic/PVC thermoplastic sheet. A commercially available product is Royalite (TM) DKE400 extrusion grain vinyl, the stock finish of the exposed upper surface of which defines a level hair-line cell structure. The Royalite (TM) DKE400 material is manufactured by and may be obtained through Uniroyal Plastics, Inc. of Mishawaka, Ind. The bed 16 may be of any desired thickness, however, typically a sheet having a thickness of about 0.03 inches is deemed appropriate. The bed 16 has an upper surface comprised of peaks and interconnected or intersecting valleys that provide continuous channels across the upper surface of the bed 16. The valleys may have a dimension of at least 0.001 inches measuring from the height of the peak to the bottom of the valleys, more desirably, 0.003–0.004 inches. Referring to FIG. 6, the texture or grain of the level hair-line cell structure inherently defined by the Royalite (TM) DKE400 stock extrusion finish vinyl sheet material is shown in greater detail. The peaks are represented therein by the white or lighter areas, and are each generally surrounded by one or more of the valleys which are represented by the black or darker areas. The vinyl sheet material is desirably of a very high impact strength with good abrasion resistance. This provides durability of the product during use such that irregularities would result in lack of good film transparency contact during the step and repeat process. Also, the sheet material desirably is stiff, has a certain degree of hardness with excellent formability. In other words, the surface maintains the peak and valley confirmation without blockage of valleys by deformation.

Auxiliary equipment is used in conjunction with the present step and repeat board 10 as illustrated in FIGS. 1–5. FIG. 1 shows a transparency 22 in place for creating the desired printing image. The auxiliary equipment includes a carrier 21 which has the film transparency 22 mounted therein. The carrier 21 is precisely located or registered with respect to the apparatus 10 through the holding members, commonly known as stripping tabs 23 and 24.

The carrier 21 is removably attached or connected to the step and repeat apparatus 10 in a selected position or registration using the stripping tabs 23, 24 and a plurality of step and repeat registration pins 26, also referred to as indexing spacers 26 or stepping spacers 26. The stripping tabs 23, 24 are mounted between the apparatus 10 and the carrier 21 with the stripping tabs 23, 24 being affixed to the top surface of the carrier 21 using strips of tape 25 so that one end of each of the stripping tabs 23, 24 will extend outwardly over the openings 12, 13. Each indexing spacer 26 has a pair of downwardly projecting pins 26a, 26b which are spaced apart a distance equal to the spacing of the openings 12, 13, and may be received therein. In other words, the downwardly extending pins 26a and 26b are lodged in selected openings 12, 13 in the board 11 adjacent to where a stripping tab 23, 24 will be affixed to the carrier 21. The upwardly extending pin 26c of the indexing spacer 26 is lodged in an opening in the stripping tab 23, 24 and a carrier 21 in the registered location, the upwardly extending pin 26c being either centered between the lower pins 26a, 26b or offset toward one pin 26a, 26b a preselected distance by which the carrier 21 is being "stepped" to adjust its registration position relative to the step and repeat apparatus 10. The carrier 21 can be removed, moved to another set of indexing spacers 26 in a different location on the board 11, and again secured with the stripping tabs 23, 24 and indexing spacers 26 as described above.

While the preferred embodiment of the above step and repeat apparatus has been described, various adaptations or modifications to the invention may be made without departing from the spirit and scope of the appended claims.

What is claimed is:

1. In an apparatus for positioning a film transparency in a vacuum frame and drawing a vacuum thereon, said apparatus including a bed, a registering device arranged along at least one side of said bed and having a length, said registering device having a plurality of indexing holes of like configuration spaced at regular intervals along said length, the improvement wherein said bed comprises:

at least one layer having an exposed upper surface of level hair-line cell structure, said level hair-line cell structure being composed of a plurality of peaks and a plurality of valleys, said plurality of valleys each intersecting one another and generally surrounding said peaks.

2. The apparatus of claim 1 wherein the exposed upper surface is composed of peaks and valleys oriented so that the valleys extend in a direction toward the plurality of indexing holes, whereby the vacuum may be drawn surrounding the exposed upper surface of the bed from said direction when the film transparency is disposed in close proximity above the exposed upper surface.

3. The apparatus of claim 1 wherein the plurality of valleys have a depth of between 0.001 and 0.008 inches.

4. The apparatus of claim 1 wherein the layer has a thickness of about 0.03 inches.

5. The apparatus of claim 1 wherein the layer is an acrylic/PVC thermoplastic sheet material.

6. An apparatus for positioning a film transparency within a vacuum frame and drawing a vacuum thereon, said apparatus including a bed, a registering device arranged along at least one side of said bed and having a length, said registering device having indexing holes of like configuration spaced at regular intervals along said length, said bed including a layer having an exposed upper surface of level hair-line cell structure, said level hair-line cell structure being composed of a plurality of peaks and a plurality of intersecting valleys, said plurality of intersecting valleys having an average depth of less than 0.008 inches.

7. The apparatus of claim 6 wherein each of the plurality of peaks is generally surrounded by one or more of the plurality of valleys.

8. The apparatus of claim 6 wherein the plurality of valleys are directionally oriented.

9. The apparatus of claim 8 wherein the plurality of valleys are oriented in a direction generally toward the registering device, whereby the vacuum may be drawn surrounding the exposed upper surface of the layer from said direction when the film transparency is disposed in close proximity above the exposed upper surface.

10. The apparatus of claim 6 wherein the average depth of the plurality of valleys is between 0.001 and 0.008 inches.

11. The apparatus of claim 6 wherein the average depth of the plurality of valleys is between 0.003 and 0.004 inches.

12. The apparatus of claim 6 wherein the layer is a vinyl material.

13. The apparatus of claim 6 wherein the layer is a rigid, fire-rated acrylic/PVC thermoplastic sheet material.

14. In a photocomposition board which may be placed in a vacuum frame and a vacuum drawn thereon, said photocomposition board including a bed and having at least one side edge, the improvement wherein said bed comprises:

at least one layer having an exposed upper surface of level hair-line cell structure, said level hair-line cell structure being composed of a plurality of peaks and a plurality of valleys, said plurality of valleys intersecting one another and generally surrounding said peaks.

15. The photocomposition board of claim 14 wherein the each of the plurality of valleys is oriented such that the valleys extend in a direction generally toward and at least partially communicating with the side edge of the photocomposition board, and wherein the vacuum is drawn surrounding the exposed upper surface of the layer from the side edge of the photocomposition board.

16. The photocomposition board of claim 15 wherein the number of the side edges of the photocomposition board is two, each of the two side edges opposing one another.

17. The photocomposition board of claim 14 wherein each of the plurality of valleys has an average depth of between approximately 0.001 and 0.008 inches.

18. The photocomposition board of claim 14 wherein the average depth of each of the plurality of valleys is between approximately 0.003 and 0.004 inches.

19. The photocomposition board of claim 14 wherein the layer has a thickness of approximately 0.03 inches.

20. The apparatus of claim 14 wherein the layer is an acrylic/PVC thermoplastic sheet material.

* * * * *